(12) United States Patent
Park et al.

(10) Patent No.: US 9,455,230 B1
(45) Date of Patent: Sep. 27, 2016

(54) SEMICONDUCTOR PACKAGES AND METHODS OF FABRICATING THE SAME

(71) Applicant: SK hynix Inc., Icheon-si, Gyeonggi-do (KR)

(72) Inventors: Yeon Ji Park, Icheon-si (KR); Hyeon Ji Baek, Seoul (KR); Ki Yong Lee, Seoul (KR); Jong Hyun Kim, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/878,717

(22) Filed: Oct. 8, 2015

(30) Foreign Application Priority Data

May 29, 2015 (KR) .......................... 10-2015-0076392

(51) Int. Cl.
| | |
|---|---|
| *H01L 23/29* | (2006.01) |
| *H01L 23/31* | (2006.01) |
| *H01L 23/02* | (2006.01) |
| *H01L 23/00* | (2006.01) |
| *H01L 23/498* | (2006.01) |

(52) U.S. Cl.
CPC .......... *H01L 23/562* (2013.01); *H01L 23/296* (2013.01); *H01L 23/3114* (2013.01); *H01L 23/4985* (2013.01); *H01L 23/49811* (2013.01); *H01L 23/49838* (2013.01)

(58) Field of Classification Search
CPC . H01L 23/296; H01L 23/3135; H01L 23/28; H01L 23/562; H01L 23/49838; H01L 23/4985; H01L 23/49811; H01L 23/3114; H01L 2924/181; H01L 2224/48091; H01L 21/563; H01L 23/31; H01L 23/42; H01L 23/3128

See application file for complete search history.

(56) References Cited

U.S. PATENT DOCUMENTS

| | | | | |
|---|---|---|---|---|
| 5,793,118 | A * | 8/1998 | Nakajima ............. | H01L 21/565 257/706 |
| 7,906,860 | B2 * | 3/2011 | Meyer ................... | H01L 21/561 257/723 |
| 2014/0264813 | A1 * | 9/2014 | Lin ........................ | H01L 21/563 257/690 |

FOREIGN PATENT DOCUMENTS

| | | |
|---|---|---|
| KR | 10-0524948 B1 | 11/2005 |
| KR | 10-2013-0123682 A | 11/2013 |

* cited by examiner

*Primary Examiner* — Jasmine Clark
(74) *Attorney, Agent, or Firm* — William Park & Associates Ltd.

(57) ABSTRACT

A semiconductor package includes a semiconductor chip electrically connected to a substrate, and a molding part including first molding members and second molding members arranged in an alternating pattern. The first molding members have a first physical flexibility which is different from a second physical flexibility of the second molding members.

23 Claims, 22 Drawing Sheets

SEMICONDUCTOR PACKAGES AND METHODS OF FABRICATING THE SAME

CROSS-REFERENCE TO RELATED APPLICATION

The present application claims priority under 35 U.S.C 119(a) to Korean Patent Application No. 10-2015-0076392, filed on May 29, 2015, in the Korean Intellectual Property Office, which is incorporated herein by reference in its entirety.

BACKGROUND

1. Technical Field

Various embodiments of the present disclosure relate to package technologies and, more particularly, to semiconductor packages with molding members and methods of fabricating the same.

2. Related Art

High-performance, multi-functional electronic systems are increasingly in demand. At the same time, electronic systems are increasingly scaled down, especially with the growing popularity of portable electronic systems. As a result, compact semiconductor memory devices with large capacities are often required.

In addition, with the increased interest in portable and wearable electronic systems, "flexible" electronic systems having sufficient flexibility are increasingly in demand. In such systems, a package substrate or a semiconductor chip mounted on the package substrate may have a thin profile, such that the package substrate or the semiconductor chip may be readily flexed, twisted, or warped etc. However, it may be difficult to obtain a sufficiently flexible molding member that physically and chemically protects the package substrate and the semiconductor chip.

Accordingly, reliable and flexible semiconductor packages, and methods of making the same, are desirable.

SUMMARY

Various embodiments are directed to semiconductor packages with molding members, methods of fabricating the same, electronic systems including the same, and memory cards including the same.

According to an embodiment, a semiconductor package includes a semiconductor chip electrically connected to a substrate, and a molding part disposed on the substrate and the semiconductor chip, and including first molding members and second molding members arranged in an alternating pattern. The first molding members have a first physical flexibility which is different from (e.g. less than) a second physical flexibility of the second molding members.

According to an embodiment, a semiconductor package includes a semiconductor chip electrically connected to a substrate, a molding part disposed on the substrate and the semiconductor chip, where the molding part includes first molding members and a second molding member formed over and around the first molding members. The first molding member has a first Young's modulus and the second molding member has a second Young's modulus, where the first Young's modulus is greater than the second Young's modulus.

According to an embodiment, there is provided a method of fabricating a semiconductor package. The method includes attaching a semiconductor chip to a substrate and forming a molding part on the substrate to cover the semiconductor chip. The molding part is formed to include first molding members and second molding members arranged in an alternating pattern. A first physical flexibility of the first molding members is different from (e.g. less than) a second physical flexibility of the second molding members.

According to an embodiment, there is provided an electronic system including a semiconductor package. The semiconductor package includes a semiconductor chip electrically connected to a substrate, and a molding part disposed on the semiconductor chip and the substrate, and including first molding members and second molding members arranged in an alternating pattern. The first molding members have a first physical flexibility which is different from (e.g. less than) a second physical flexibility of the second molding members.

According to an embodiment, there is provided an electronic system including a semiconductor package. The semiconductor package includes a semiconductor chip disposed on a substrate, a molding part disposed on the substrate and the semiconductor chip, where the molding part includes first molding members and a second molding member formed over and around the first molding members. Each of the first molding members has a first Young's modulus and the second molding member has a second Young's modulus, where the first Young's modulus is greater than the second Young's modulus.

According to an embodiment, there is provided a memory card including a semiconductor package. The semiconductor package includes a semiconductor chip electrically connected to a substrate, and a molding part disposed on the semiconductor chip and the substrate, and including first molding members and second molding members arranged in an alternating pattern. The first molding members have a first physical flexibility which is different from (e.g. less than) a second physical flexibility of the second molding members.

According to an embodiment, there is provided a memory card including a semiconductor package. The semiconductor package includes a semiconductor chip electrically connected to a substrate, a molding part disposed on the substrate and the semiconductor chip, where the molding part includes first molding members and a second molding member formed over and around the first molding members. Each of the first molding members has a first Young's modulus and the second molding member has a second Young's modulus, where the first Young's modulus is greater than the second Young's modulus.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Figure 1:
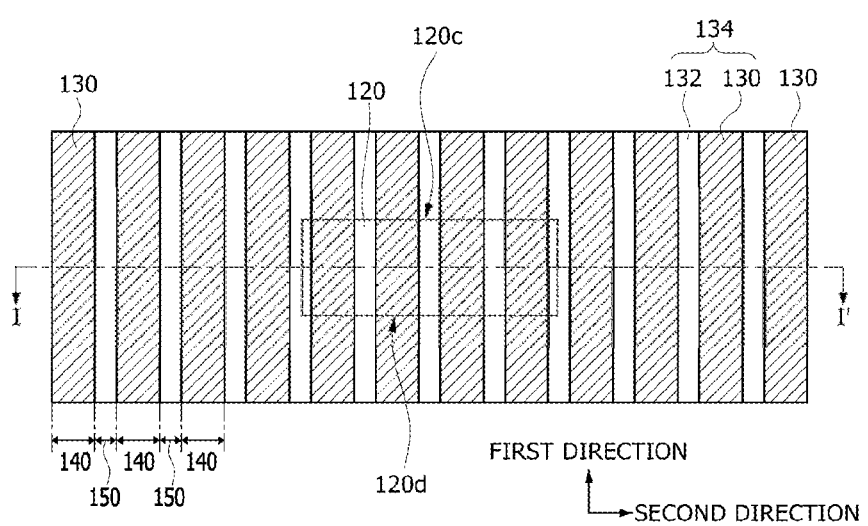
FIGS. 1 and 2 are a plan view and a cross-sectional view, respectively, illustrating a semiconductor package according to an embodiment.

Various examples of embodiments will be described hereinafter with reference to the accompanying drawings. Same reference numerals refer to like elements throughout the specification.

Figure 2:
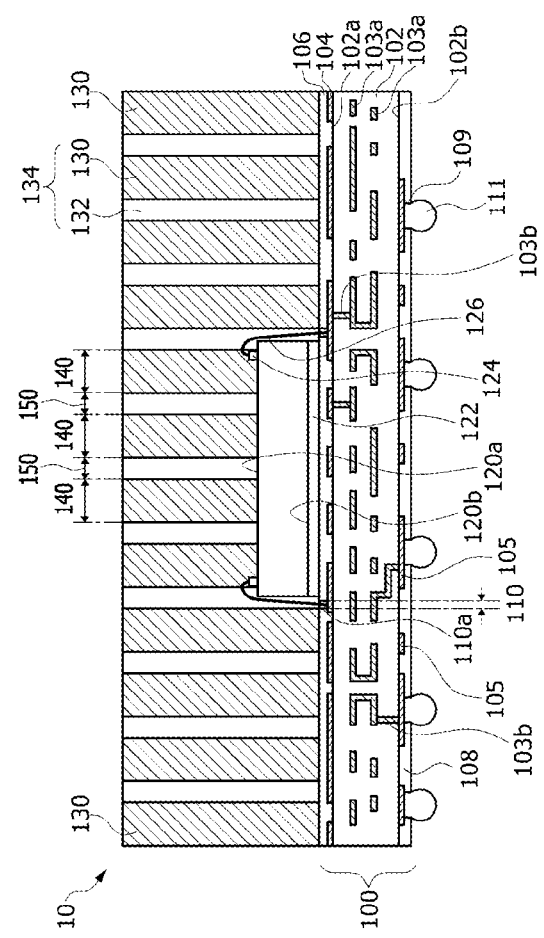
Figure 3:
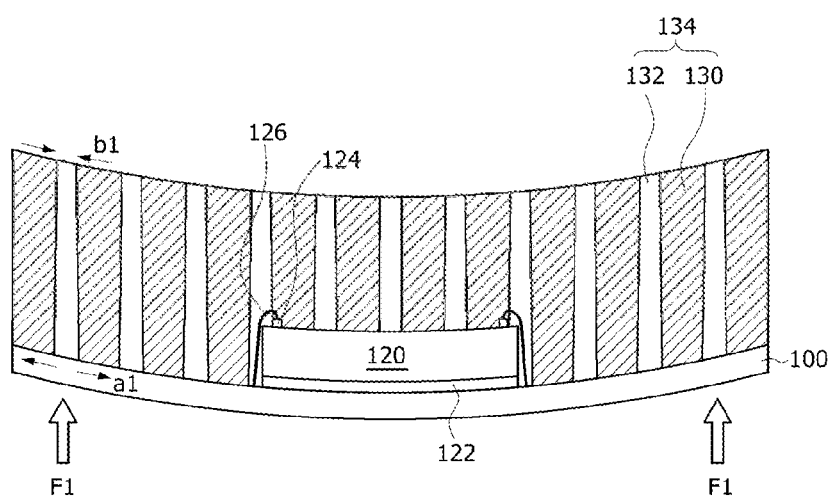
FIG. 3 is a cross-sectional view illustrating a stress relief action of a semiconductor package according to an embodiment.

FIGS. 1 and 2 are a plan view and a cross-sectional view, respectively, illustrating a representation of an example of a semiconductor package 10 according to an embodiment. The cross-sectional view of FIG. 2 is taken along a line I-I' of FIG. 1. In addition, FIG. 3 is a cross-sectional view illustrating an example of a stress relief action of a semiconductor package according to an embodiment.

In FIGS. 1 and 2, the semiconductor package 10 of an embodiment may include a substrate 100, a semiconductor chip 120 disposed on the substrate 100, and a molding part 134 disposed on a surface of the substrate 100 to cover the semiconductor chip 120. The molding part 134 may include first molding members 130 and second molding members 132.

Each one of the first molding members 130 and the second molding members 132 may be formed as rectangular or planar strips. The first molding members 130 and the second molding members 132 may be alternately arranged or arrayed in a lateral direction. Put another way, the first molding members 130 and the second molding members 132 may be arranged in an alternating pattern. In addition, the first molding members 130 may have a first physical flexibility which is different from (e.g. less than) a second physical flexibility of the second molding members 132.

The substrate 100 may be or include a plate member including a body 102, first outer interconnection patterns 104, second outer interconnection patterns 105, outer insulation layers 106 and 108, inner interconnection patterns 103*a* and via electrodes 103*b*. The substrate 100 may include a printed circuit board (PCB), an organic substrate or an insulation substrate. If the substrate 100 includes a PCB, the PCB may be a flexible PCB which is capable of being readily flexed, twisted, or warped. If the substrate 100 includes an insulation substrate, the body 102 may be made formed of or include an insulation material. If the substrate 100 includes an organic substrate, the body 102 may be formed of or include an organic material. In various embodiments, the organic material may be or include at least one selected from the group consisting of a polymer resin material, an epoxy resin material and a plastic material.

The body 102 of the substrate 100 may include a front-side surface 102*a* on which the semiconductor chip 120 is disposed and a back-side surface 102*b* that is opposite to the front-side surface 102*a*. The first outer interconnection patterns 104 may be disposed on the front-side surface 102*a* of the body 102, and the second outer interconnection patterns 105 may be disposed on the back-side surface 102*b* of the body 102. Each of the first and second interconnection patterns 104 and 105 may include a copper material.

The inner interconnection patterns 103*a* and the via electrodes 103*b* may be disposed in the body 102, and the via electrodes 103*b* may electrically connect the inner interconnection patterns 103*a* to the outer interconnection patterns 104 and 105. Each of the inner interconnection patterns 103*a* and the via electrodes 103*b* may be or include a copper material. In various embodiments, the inner interconnection patterns 103*a* may be or include a multi-layered structure. Each of the via electrodes 103*b* may provide a signal path that connects one of the inner interconnection patterns 103*a* to one of the first outer interconnection patterns 104 or one of the second outer interconnection patterns 105.

The first and second outer interconnection patterns 104 and 105 disposed on the front-side surface 102*a* and the back-side surface 102*b* of the body 102 may be covered with the outer insulation layers 106 and 108, respectively. That is, the outer insulation layers 106 and 108 may include a first insulation layer 106 disposed on the front-side surface 102*a* of the body 102 to cover the first outer interconnection patterns 104 and a second insulation layer 108 disposed on the back-side surface 102*b* of the body 102 to cover the second outer interconnection patterns 105. Each of the first and second outer insulation layers 106 and 108 may include a solder resist material.

The first outer insulation layer 106 may include first openings 110*a* that expose portions of the first outer interconnection patterns 104. The portions of the first outer interconnection patterns 104 exposed by the first openings 110*a* may act as substrate pads 110.

The second outer insulation layer 108 disposed on the back-side surface 102*b* of the body 102 may include second openings 109 that expose portions of the second outer interconnection patterns 105. The portions of the second outer interconnection patterns 105 exposed by the second openings 109 may act as ball land pads to which external connection terminals 111 are attached. In various embodiments, the external connection terminals 111 may be or include solder balls.

The semiconductor chip 120 may be disposed on the first outer insulation layer 106 of the substrate 100. The semiconductor chip 120 may be fixed to the first outer insulation layer 106 by an adhesive member 122 provided between the semiconductor chip 120 and the first outer insulation layer 106, but the present disclosure is not limited thereto. The adhesive member 122 may be or include an adhesive agent or an adhesive tape. In various embodiments, the adhesive member 122 may be or include a die attach film (DAF).

A plurality of active devices, such as transistors, may be disposed in the semiconductor chip 120. In some cases, passive devices, such as capacitors and/or resistors, may also be disposed in the semiconductor chip 120. The semiconductor chip 120 may include a first surface 120*a* and a second surface 120*b* that are opposite to each other, and the active devices may be disposed in active layers which is adjacent to the first surface 120*a*. A plurality of chip pads 124 may be disposed on the first surface 120*a* of the semiconductor chip 120. Although FIG. 2 illustrates an example in which the chip pads 124 are disposed on edges of the semiconductor chip 120, the present disclosure is not limited thereto. Each of the chip pads 124 may be formed of or include an aluminum material or a copper material.

The semiconductor chip 120 may be electrically connected to the substrate 100 through interconnection members 126. Although FIG. 2 illustrates an example in which the interconnection members 126 are metal wires, the present disclosure is not limited thereto. For example, in various embodiments, the semiconductor chip 120 may be mounted on the substrate 100 in a flip chip form. In such a case, the semiconductor chip 120 may be electrically connected to the substrate 100 through metal bumps without using metal wires. If the interconnection members 126 are metal wires, first ends of the metal wires may be bonded to the chip pads 124 of the semiconductor chip 120 and second ends of the metal wires may be bonded to the substrate pads 110 of the substrate 100. Thus, the semiconductor chip 120 may be electrically connected to the substrate 100 through the metal wires.

The molding part 134 may be disposed on a surface of the substrate 100 to cover the semiconductor chip 120. The molding part 134 may include the first molding members 130 having a first Young's modulus and the second molding members 132 having a second Young's modulus, where the first Young's modulus is different from (e.g. greater than) the second Young's modulus.

Young's modulus may be referred to as the tensile modulus or modulus of elasticity, a measure of the force per unit area to stretch or compress a material sample. More particularly, Young's modulus may be characterized as the ratio of stress-to-strain, where stress is represented in units of pressure and the strain is dimensionless. Thus, Young's modulus may be expressed in units of pressure, which is the Pascal (Pa) in the International Systems of Units (SI), or more commonly megapascals (MPa or N/mm$^2$) or gigapascals (GPa or kN/mm$^2$) in practice. In United States customary units, Young's modulus may be expressed as pounds (i.e. force) per square inch (psi).

The difference between first Young's modulus of the first molding members 130 and the second Young's modulus of the second molding members 132 may be expressed as a percentage or a ratio. The first Young's modulus may be greater than the second Young's modulus by a predetermined percentage, or by a predetermined percentage within a range of predetermined percentages. For example, the first Young's modulus may be greater than the second Young's modulus by 100% or greater. As another example, the first Young's modulus may be greater than the second Young's modulus by a percentage within a range of 100-4000%. However, any suitable percentage selected to achieve the desired purposes may be utilized.

In an embodiment, each of the first molding members 130 may be formed of or include an insulation material having a first Young's modulus within a range of about 20 GPa to about 30 GPa. The insulation material having the first Young's modulus may be or include, for example, an epoxy molding compound (EMC) material.

Further, each of the second molding members 132 may be formed of or include an insulation material having a second Young's modulus within a range of about 0.01 GPa to about 0.1 GPa. The insulation material having the second Young's modulus may be or include, for example, a silicone resin material or a silicone rubber material.

In an embodiment where the first Young's modulus is within a range of about 20 GPa to about 30 GPa, and the second Young's modulus is within a range of about 0.001 GPa to about 0.1 GPa, the first Young's modulus is greater than the second Young's modulus by a percentage within a range of about 200-4000%.

As shown in FIG. 1, the first molding members 130 and the second molding members 132 may be disposed on the substrate 100 and the semiconductor chip 120 Each one of the first molding members 130 and the second molding members 132 may be formed as rectangular or planar strips. The first molding members 130 may be alternately arranged or arrayed with the second molding members 132. Put another way, the first molding members 130 and the second molding members 132 may be arranged in an alternating pattern. The first molding members 130 may extend in a first direction to form a stripe shape, and may be spaced apart from each other in a second direction perpendicular to the first direction. The second molding members 132 may be disposed between the first molding members 130 to form a stripe shape extending in the first direction. Accordingly, the first molding members 130 and the second molding members 132 may be alternately arranged or arrayed in the second direction, and may extend in the first direction to form a stripe shape.

Since the first Young's modulus of the first molding members 130 is greater than the second Young's modulus of the second molding members 132, the first molding members 130 may be more rigid than the second molding members 132. Thus, two of the first molding members 130 may be disposed on both outermost edges of the substrate 100 to act as supporters that maintain an outline of the molding part 134. In addition, the first and second molding members 130 and 132 disposed on the semiconductor chip 120 may extend in the first direction to overlap with two opposite sidewalls 120c and 120d of the semiconductor chip 120 as well as the first surface 120a corresponding to a top surface of the semiconductor chip 120.

Since the first molding members 130 and the second molding members 132 are alternately arranged or arrayed on the substrate 100 and the semiconductor chip 120, the molding part 134 may be divided into first regions 140 having a first physical flexibility and second regions 150 having a second physical flexibility. The first regions 140 having the first physical flexibility may correspond to regions in which the first molding members 130 are disposed, and the second regions 150 having the second physical flexibility may correspond to regions in which the second molding members 132 are disposed.

Because the first molding members 130 having the first Young's modulus that is greater than the second Young's modulus of the second molding members 132, the second physical flexibility of the second regions 150 may be greater than the first physical flexibility of the first regions 140. Accordingly, the second regions 150 may be more readily flexed, twisted, or warped as compared with the first regions 140.

Since the second regions 150 having a relatively high physical flexibility are disposed between the first regions 140, the second regions 150 may relieve the stress that is locally concentrated on the semiconductor package 10 when an external force is applied to the semiconductor package 10.

As illustrated in FIG. 3, if an external force F1 is applied to the substrate 100, the semiconductor package 10 may flex or warp. As a result, the second molding members 132 may be flexibly extended or compressed.

For example, bottom surfaces of the second molding members 132 may be extended as indicated by first arrows "a1", and top surfaces of the second molding members 132 may be compressed as indicated by second arrows "b1". That is, if the second molding members 132 are locally extended or compressed, the positions of first molding members 130 may change to cause the flexing or warpage of the semiconductor package 10. In such a case, the stress applied to the substrate 100 and the semiconductor chip 120 may be dispersed because of the presence of the second molding members 132. Accordingly, the substrate 100 and the semiconductor chip 120 may not be damaged by a tensile stress or a compressive stress, even though the semiconductor package 10 is flexed, twisted, or warped by the external force F1.

Figure 4:
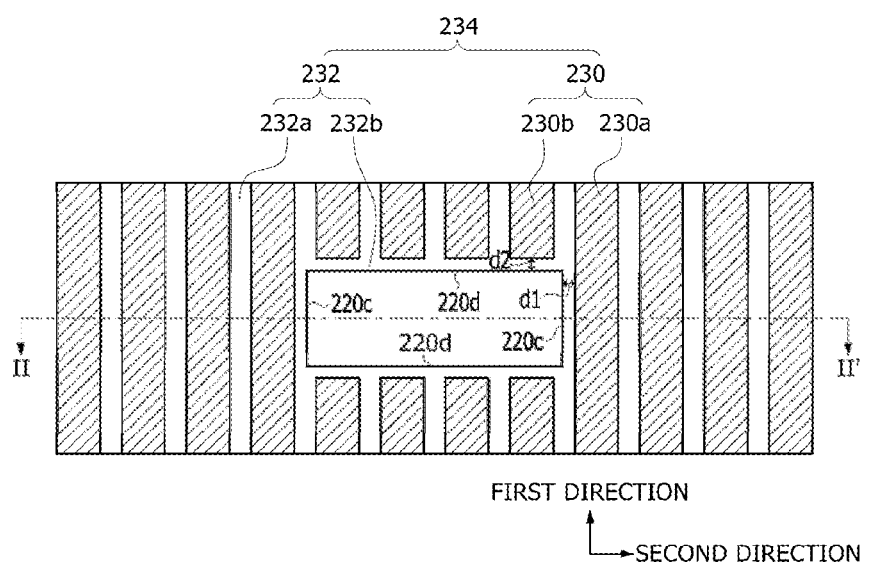
FIGS. 4 and 5 are a plan view and a cross-sectional view, respectively, illustrating a semiconductor package according to an embodiment.
Figure 5:
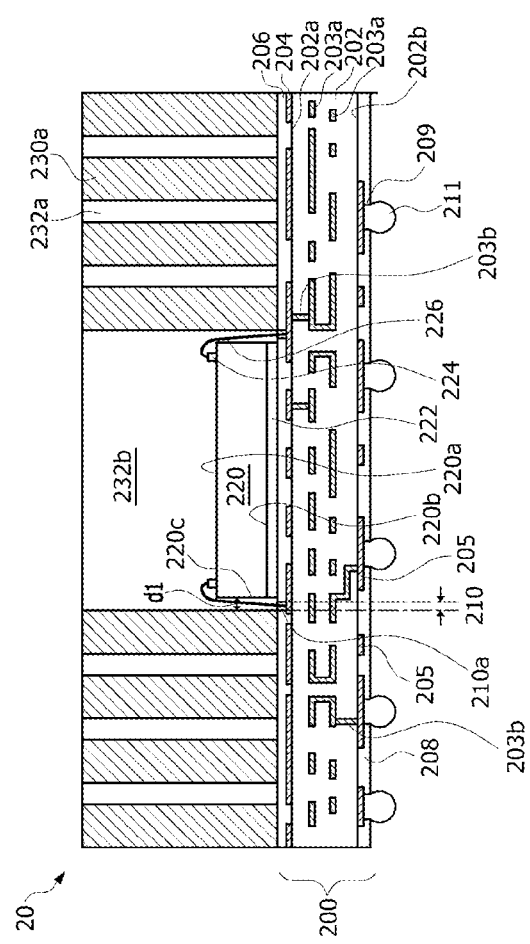

FIGS. 4 and 5 are a plan view and a cross-sectional view, respectively, of a semiconductor package 20 according to an embodiment. The cross-sectional view of FIG. 5 is taken along a line II-II' of FIG. 4.

Referring to FIGS. 4 and 5, the semiconductor package 20 of an embodiment may include a substrate 200, a semiconductor chip 220 disposed on the substrate 200, and a molding part 234 disposed on the substrate 200. The molding part 234 may include first molding members 230 and second molding members 232. The first molding members 230 may have a first physical flexibility which is different from (e.g. less than) a second physical flexibility of the second molding members 232.

The substrate 200 may be or include a plate member including a body 202, outer interconnection patterns 204 and 205, outer insulation layers 206 and 208, inner interconnection patterns 203a and via electrodes 203b. The substrate 200 may include a PCB, an organic substrate or an insulation substrate. The body 202 of the substrate 200 may include a front-side surface 202a and a back-side surface 202b that are opposite to each other. The outer interconnection patterns 204 and 205 may include first outer interconnection patterns 204 disposed on the front-side surface 202a of the body 202, and second outer interconnection patterns 205 disposed on the back-side surface 202b of the body 202. Each of the first and second interconnection patterns 204 and 205 may be formed of or include a copper material.

The inner interconnection patterns 203a and the via electrodes 203b may be disposed in the body 202 The via electrodes 203b may electrically connect the inner interconnection patterns 203a to the first outer interconnection patterns 204 and the second outer interconnection patterns 205. Each of the inner interconnection patterns 203a and the via electrodes 203b may be formed of or include a copper material.

The first outer interconnection patterns 204 disposed on the front-side surface 202a of the body 202 may be covered with a first outer insulation layer 206 of the outer insulation layers 206 and 208 The second outer interconnection patterns 205 disposed on the back-side surface 202b of the body 202 may be covered with a second outer insulation layer 208 of the outer insulation layers 206 and 208. Each of the first and second outer insulation layers 206 and 208 may be formed of or include, for example, a solder resist material.

The first outer insulation layer 206 may include first openings 210a that expose substrate pads 210 corresponding to portions of the first outer interconnection patterns 204. The second outer insulation layer 208 may include second openings 209 that expose portions of the second outer interconnection patterns 205. The portions of the second outer interconnection patterns 205 exposed by the second openings 209 may serve as ball land pads to which external connection terminals 211, such as solder balls, are attached.

The semiconductor chip 220 may be disposed on the first outer insulation layer 206 of the substrate 200. The semiconductor chip 220 may be fixed to the first outer insulation layer 206 by an adhesive member 222 provided between the semiconductor chip 220 and the first outer insulation layer 206.

The semiconductor chip 220 may include a first surface 220a and a second surface 220b that are opposite to each other. The semiconductor chip 220 may also include active layers adjacent to the first surface 220a Active devices, such as transistors, may be disposed in the active layers. A plurality of chip pads 224 may be disposed on the first surface 220a of the semiconductor chip 220. Each of the chip pads 224 may be formed of or include an aluminum material or a copper material.

The semiconductor chip 220 may be electrically connected to the substrate 200 through interconnection members 226. Although FIG. 5 illustrates an example in which the interconnection members 226 are metal wires, the present disclosure is not limited thereto. For example, in various embodiments, the semiconductor chip 220 may be mounted on the substrate 200 in a flip chip form. In such a case, the semiconductor chip 220 may be electrically connected to the substrate 200 through metal bumps without using metal wires. If the interconnection members 226 are metal wires, first ends of the metal wires may be bonded to the chip pads 224 of the semiconductor chip 220 and second ends of the metal wires may be bonded to the substrate pads 210 of the substrate 200.

The molding part 234 may be disposed on a surface of the substrate 200 to cover the semiconductor chip 220. The molding part 234 may include the first molding members 230 and the second molding members 232.

Each one of the first molding members 230 and the second molding members 232 may be formed as rectangular or planar strips. The first molding members 230 and the second molding members 232 may be alternately arranged or arrayed in a lateral direction. Put another way, the first molding members 230 and the second molding members 232 may be arranged in an alternating pattern.

The first molding members 230 may have a first Young's modulus and the second molding members 232 may have a second Young's modulus, where the first Young's modulus is different from (e.g. greater than) the second Young's modulus. The first Young's modulus may be greater than the second Young's modulus by a predetermined percentage, or by a predetermined percentage within a range of predetermined percentages. For example, the first Young's modulus may be greater than the second Young's modulus by 100% or greater. As another example, the first Young's modulus may be greater than the second Young's modulus by a percentage within a range of 100-4000%. However, any suitable percentage selected to achieve the desired purposes may be utilized.

In an embodiment, each of the first molding members 230 may be formed of or include an insulation material having a first Young's modulus within a range of about 20 GPa to about 30 GPa. In various embodiments, the insulation material having the first Young's modulus may be or include an epoxy molding compound (EMC) material.

Further, each of the second molding members 232 may be formed of or include an insulation material having the second Young's modulus within a range of about 0.01 GPa to about 0.1 GPa. The insulation material having the second Young's modulus may be or include, for example, a silicone resin material or a silicone rubber material.

Referring to FIG. 4, the first molding members 230 may include first patterns 230a and second patterns 230b. The semiconductor chip 220 may include a pair of first sidewalls 220c which are opposite to each other and parallel with a first direction. The semiconductor chip 220 may also include a pair of second sidewalls 220d which are opposite to each other and parallel with a second direction perpendicular to the first direction.

In such a case, the first patterns 230a of the first molding members 230 may be arranged adjacent the first sidewalls 220c, spaced apart from each other in the second direction, and form stripe shapes extending in the first direction. The first patterns 230a closest to the semiconductor chip 220 may be spaced apart from the first sidewalls 220c by a first gap "d1". The second patterns 230b of the first molding members 230 may be arranged adjacent the second sidewalls 220d, spaced apart from each other in the second direction, and form stripe shapes extending in the first direction. The second patterns 230b may be spaced apart from the second sidewalls 220d by a second gap "d2".

Accordingly, a length of the second patterns 230b may be less than a length of the first patterns 230a. Two of the first patterns 230a may be disposed on both outermost edges of the substrate 200 to act as supporters that maintain an outline feature of the molding part 234.

The second molding members 232 may be disposed between the first molding members 230. The second molding members 232 may include first patterns 232a disposed between the first patterns 230a of the first molding members 230, and second patterns 232b disposed to surround the second patterns 230b and the semiconductor chip 220. The second molding members 232 may be disposed to fill the first and second gaps "d1" and "d2".

As a result, the semiconductor chip 220 may be surrounded by the second molding members 232 having a physical flexibility which is greater than that of the first molding members 230. Thus, if an external force is applied to the semiconductor package 20, the semiconductor package 20 may be flexed, twisted, or warped without damage of the semiconductor chip 220.

Figure 6:
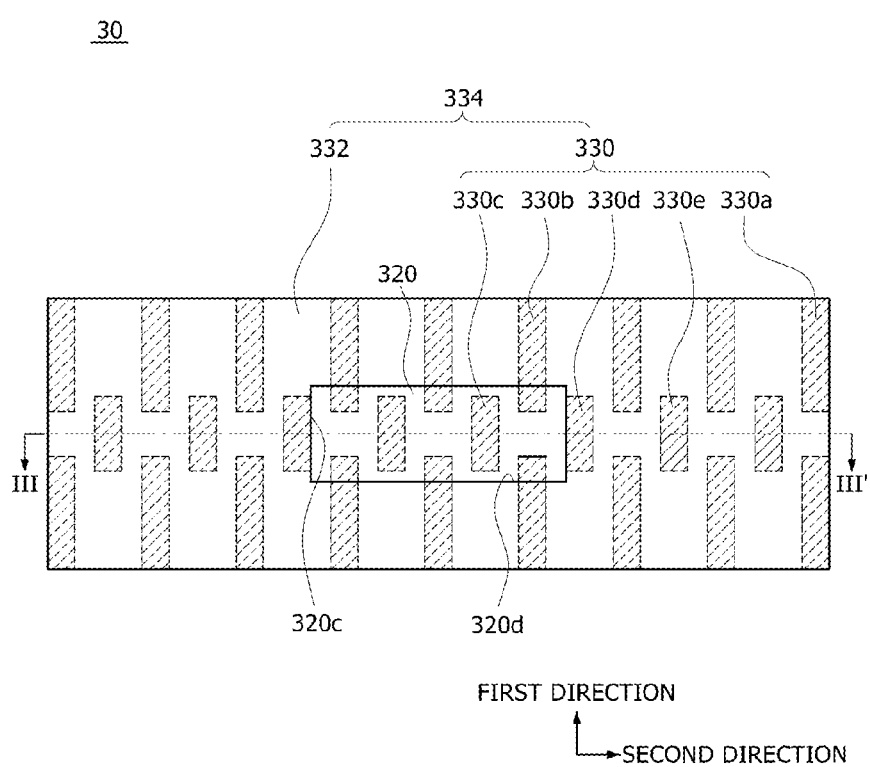
FIGS. 6 and 7 are a plan view and a cross-sectional view, respectively, illustrating a semiconductor package according to an embodiment.
Figure 7:
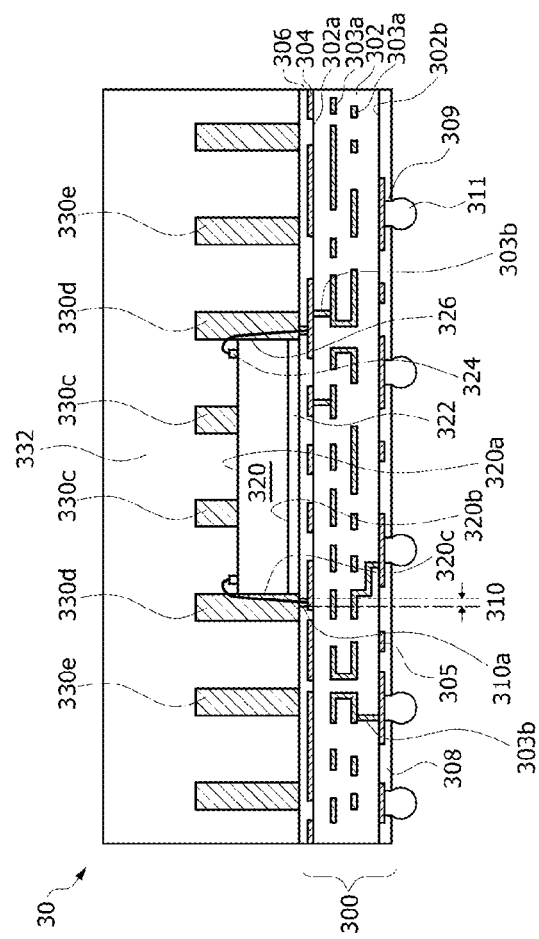

FIGS. 6 and 7 are a plan view and a cross-sectional view, respectively, of a semiconductor package 30 according to an embodiment. The cross-sectional view is taken along a line III-III' of FIG. 6.

Referring to FIGS. 6 and 7, the semiconductor package 30 may include a substrate 300, a semiconductor chip 320 disposed on the substrate 300, and a molding part 334 disposed on the substrate 300. The molding part 334 may include first molding members 330 and a second molding member 332. First molding members 330 may have a first physical flexibility which is different from (e.g. less than) a second physical flexibility of the second molding member 332.

The substrate 300 may be or include a plate member including a body 302, outer interconnection patterns 304 and 305, outer insulation layers 306 and 308, inner interconnection patterns 303a and via electrodes 303b. The substrate 300 may include a PCB, an organic substrate or an insulation substrate. The body 302 of the substrate 300 may include a front-side surface 302a and a back-side surface 302b that are opposite to each other.

The outer interconnection patterns 304 and 305 may include first outer interconnection patterns 304 disposed on the front-side surface 302a of the body 302, and second outer interconnection patterns 305 disposed on the back-side surface 302b of the body 302. Each of the first and second interconnection patterns 304 and 305 may be formed of or include a copper material. Each of the inner interconnection patterns 303a and the via electrodes 303b may be formed of or include a copper material.

The first outer interconnection patterns 304 disposed on the front-side surface 302a of the body 302 may be covered with a first outer insulation layer 306 of the outer insulation layers 306. Similarly, the second outer interconnection patterns 305 disposed on the back-side surface 302b of the body 302 may be covered with a second outer insulation layer 308 of the outer insulation layers 306 and 308. Each of the first and second outer insulation layers 306 and 308 may be formed of or include, for example, a solder resist material.

The first outer insulation layer 306 may include first openings 310a that expose substrate pads 310 corresponding to portions of the first outer interconnection patterns 304. The second outer insulation layer 308 may include second openings 309 that expose portions of the second outer interconnection patterns 305. The portions of the second outer interconnection patterns 305 exposed by the second openings 309 may serve as ball land pads to which external connection terminals 311, such as solder balls, are attached.

The semiconductor chip 320 may be disposed on the first outer insulation layer 306 of the substrate 300. The semiconductor chip 320 may be fixed to the first outer insulation layer 306 by an adhesive member 322 provided between the semiconductor chip 320 and the first outer insulation layer 306.

The semiconductor chip 320 may include a first surface 320a and a second surface 320b that are opposite to each other. The semiconductor chip 320 may also include active layers adjacent to the first surface 320a Active devices, such as transistors, may be disposed in the active layers. Also, a plurality of chip pads 324 may be disposed on the first surface 320a of the semiconductor chip 320. Each of the chip pads 324 may be formed of or include an aluminum material or a copper material.

The semiconductor chip 320 may be electrically connected to the substrate 300 through interconnection members 326. Although FIG. 7 illustrates an example in which the interconnection members 326 are metal wires, the present disclosure is not limited thereto. For example, in various embodiments, the semiconductor chip 320 may be mounted on the substrate 300 in a flip chip form. In such a case, the semiconductor chip 320 may be electrically connected to the substrate 300 through metal bumps without using metal wires. If the interconnection members 326 are metal wires, first ends of the metal wires may be bonded to the chip pads 324 of the semiconductor chip 320 and second ends of the metal wires may be bonded to the substrate pads 310 of the substrate 300.

Referring back to FIG. 6, the semiconductor chip 320 may include a pair of second sidewalls 320c which are opposite to each other and parallel with a first direction. The semiconductor chip 320 may also include a pair of first sidewalls 320d which are opposite to each other and parallel with a second direction perpendicular with the first direction.

The molding part 334 may be disposed on a surface of the substrate to cover the semiconductor chip 320. The molding part 334 may include the first molding members 330 and the second molding member 332. Each one of the first molding members 330 may be formed as rectangular or planar strips. In general, the first molding members 330 may be formed in one or more striped patterns within the second molding member 332.

In an embodiment, the first molding members 330 may include first striped patterns 330a and 330b and second striped patterns 330c, 330d and 330e. The first striped patterns 330a and 330b of the first molding members 330 may be arranged in a matrix form along the first and second directions. That is, the first striped patterns 330a and 330b may be spaced apart from each other in the first and second directions.

A first group of the first striped patterns 330a may be disposed on adjacent sides of the second sidewalls 320c of the semiconductor chip 320 to extend in the first direction. A second group of the first striped patterns 330b may be disposed on adjacent sides of the first sidewalls 320d of the semiconductor chip 320 to extend in the first direction. The second group of the first striped patterns 330b may extend in the first direction to overlap with portions of the first surface 320a of the semiconductor chip 320. Some of the first group of the first striped patterns 330a may be disposed on both outermost edges of the substrate 200 to serve as supporters that maintain an outline of the molding part 334.

A first group of the second striped patterns 330c may be disposed on the first surface 320a of the semiconductor chip 320. A second group of the second striped patterns 330d may be disposed to contact the second sidewalls 320c of the semiconductor chip 320 A third group of the second striped patterns 330e may be disposed between the first group of the first striped patterns 330a. The second striped patterns 330c, 330d and 330e may be spaced apart from each other in the second direction. In an embodiment, the first striped patterns 330a and 330b and the second striped patterns 330c, 330d and 330e may be arranged in a grid form.

The first molding members 330 may have a first Young's modulus and the second molding members 332 may have a second Young's modulus, where the first Young's modulus is different from (e.g. greater than) the second Young's modulus.

The first Young's modulus may be greater than the second Young's modulus by a predetermined percentage, or by a predetermined percentage within a range of predetermined percentages. For example, the first Young's modulus may be greater than the second Young's modulus by 100% or greater. As another example, the first Young's modulus may be greater than the second Young's modulus by a percentage within a range of 100-4000%. However, any suitable percentage selected to achieve the desired purposes may be utilized.

In an embodiment, each of the first molding members 330 may be formed of or include an insulation material having a first Young's modulus within a range of about 20 GPa to about 30 GPa. In various embodiments, the insulation material having the first Young's modulus may be or include, for example, an epoxy molding compound (EMC) material.

The second molding member 332 of the molding part 334 may be disposed to fill a space between the first and second patterns 330a, 330b, 330c, 330d and 330e of the first molding members 330, and to cover top surfaces of the first and second patterns 330a, 330b, 330c, 330d and 330e. That is, the second molding member 332 may be disposed to have a predetermined thickness on the top surfaces of the first molding members 330.

In an embodiment, the second molding member 332 may include an insulation material having the second Young's modulus within a range of about 0.01 GPa to about 0.1 GPa. In various embodiments, the insulation material having the second Young's modulus may be or include, for example, a silicone resin material or a silicone rubber material.

Figure 8:
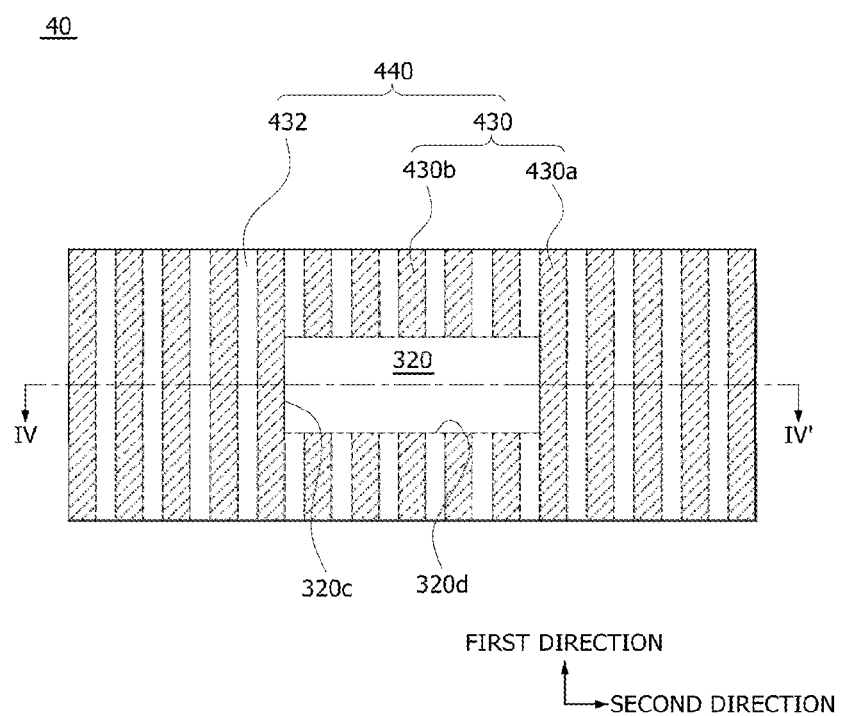
FIGS. 8 and 9 are a plan view and a cross-sectional view, respectively, illustrating a semiconductor package according to an embodiment.
Figure 9:
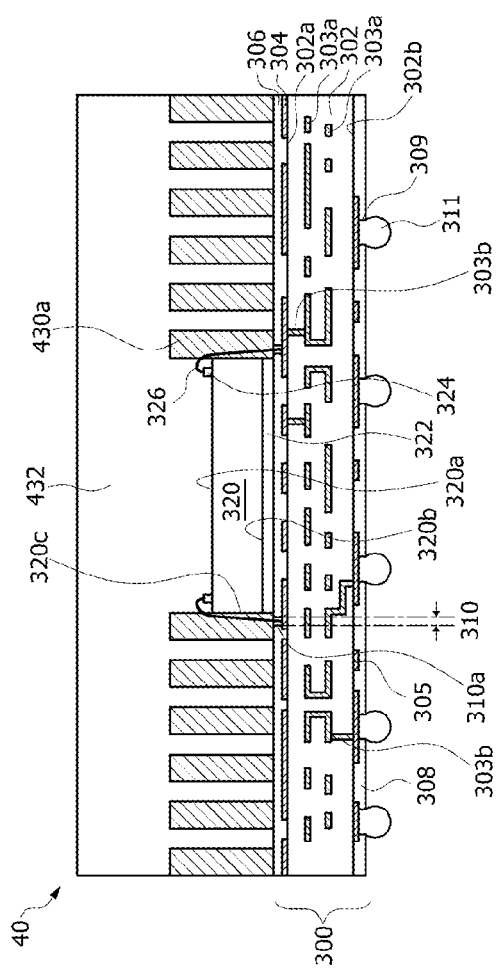

In an embodiment where the first Young's modulus is within a range of about 20 GPa to about 30 GPa, and the second Young's modulus is within a range of about 0.001 GPa to about 0.1 GPa, the first Young's modulus is greater than the second Young's modulus by a percentage within a range of about 200-4000%. FIGS. 8 and 9 are a plan view and a cross-sectional view, respectively, illustrating a semiconductor package 40 according to an embodiment. The cross-sectional view of FIG. 9 is taken along a line IV-IV' of FIG. 8.

The semiconductor package 40 of FIGS. 8 and 9 may have substantially the same configuration as the semiconductor package 30 described with reference to FIGS. 6 and 7, except with respect to the molding part 334 of the semiconductor package 30.

The semiconductor package 40 of FIGS. 8 and 9 may include the substrate 300, the semiconductor chip 320 disposed on the substrate 300, and a molding part 440 disposed on the substrate 300. The molding part 440 may include first molding members 430 and a second molding member 432. The first molding members 430 may have a first physical flexibility which is different from (e.g. less than) a second physical flexibility of the second molding member 432.

The semiconductor chip 320 may be disposed on the first outer insulation layer 306 of the substrate 300. The semiconductor chip 320 may be fixed to the first outer insulation layer 306 by the adhesive member 322. The semiconductor chip 320 may be electrically connected to the substrate 300 through the interconnection members 326 such as metal wires.

The molding part 440 may be disposed on a surface of the substrate 300 to cover the semiconductor chip 320. The molding part 440 may include the first molding members 430 and the second molding member 432.

Referring specifically to FIG. 8, the first molding members 430 may include first patterns 430a and second patterns 430b. The first patterns 430a of the first molding members 430 may be arranged on adjacent sides of the second sidewalls 320c of the semiconductor chip 320. The first patterns 430a may be spaced apart from each other in the second direction and to have stripe shapes extending in the first direction.

Two of the first patterns 430a may be disposed to directly contact the second sidewalls 320c of the semiconductor chip 320, respectively. In addition, two of the first patterns 430a may be disposed on both outermost edges of the substrate 300 to serve as supporters to maintain an outline of the molding part 440. The pair of first patterns 430a contacting the second sidewalls 320c of the semiconductor chip 320 may provide support for the semiconductor chip 320. The second patterns 430b may be arranged on adjacent sides of the second sidewalls 320d to be spaced apart from each other in the second direction, and to have stripe shapes extending in the first direction. The second patterns 430b may contact the second sidewalls 320d.

The first molding members 430 may have a first Young's modulus and the second molding members 432 may have a second Young's modulus, where the first Young's modulus is different from (e.g. greater than) the second Young's modulus.

The first Young's modulus may be greater than the second Young's modulus by a predetermined percentage, or by a predetermined percentage within a range of predetermined percentages. For example, the first Young's modulus may be greater than the second Young's modulus by 100% or greater. As another example, the first Young's modulus may be greater than the second Young's modulus by a percentage within a range of 100-4000%. However, any suitable percentage selected to achieve the desired purposes may be utilized. In an embodiment, each of the first molding members 430 of the molding part 440 may be formed of or include an insulation material having a first Young's modulus of about 20 GPa to about 30 GPa. For example, the insulation material having the first Young's modulus may be or include, for example, an epoxy molding compound (EMC) material. The second molding member 432 may fill spaces between the first and second patterns 430*a* and 430*b*, and may extend to cover top surfaces of the first and second patterns 430*a* and 430*b*.

Further, the second molding member 432 may be formed of or include an insulation material having a second Young's modulus which is less than the first Young's modulus. In an embodiment, the second molding member 432 may be formed of or include an insulation material having the second Young's modulus of about 0.01 GPa to about 0.1 GPa. In various embodiments, the insulation material having the second Young's modulus may be or include, for example, a silicone resin material or a silicone rubber material.

FIGS. 10 to 15 are cross-sectional views and plan views for use in describing a method of fabricating a semiconductor package according an embodiment.

Figure 10:
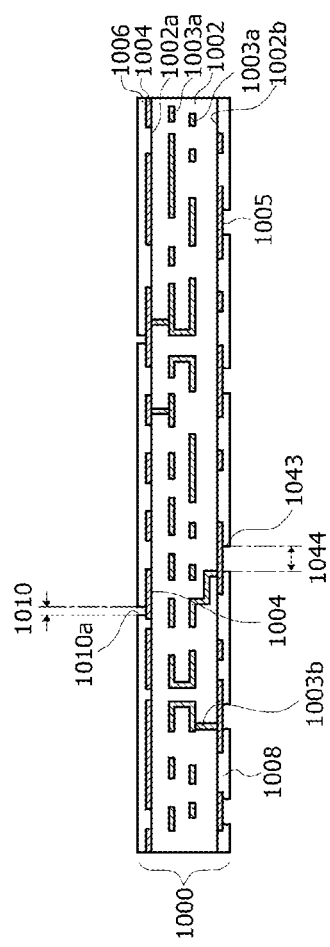
FIGS. 10 to 15 are cross-sectional views and plan views illustrating a method of fabricating a semiconductor package according an embodiment.

Referring to FIG. 10, a substrate 1000 may be provided. The substrate 1000 may include a body 1002 serving as a base member, outer interconnection patterns 1004 and 1005 formed on two opposite surfaces of the body 1002, and outer insulation layers 1006 and 1008 covering the outer interconnection patterns 1004 and 1005.

The substrate 1000 may be formed of or include a flexible material. In various embodiments, the substrate 1000 may be a flexible PCB, a flexible insulation substrate, or a flexible organic substrate. If the substrate 1000 is an organic substrate, the body 1002 may be formed to include an organic material which is capable of being flexed, twisted, or warped. In various embodiments, the organic material of the body 1002 may be formed of include at least one selected from the group consisting of a polymer resin material, an epoxy resin material and a plastic material. The body 1002 may include a front-side surface 1002*a* and a back-side surface 1002*b* that are opposite to each other.

The outer interconnection patterns 1004 and 1005 may include first outer interconnection patterns 1004 formed on the front-side surface 1002*a* of the body 1002 and second interconnection patterns 1005 formed on the back-side surface 1002*b* of the body 1002. The first outer interconnection patterns 1004 or the second interconnection patterns 1005 may be formed by performing a subtractive method, for example, which includes depositing a copper foil on the body 1002 and selectively etching portions of the copper foil to form circuit patterns. Alternatively, an additive method may performed, which includes directly forming circuit patterns on the front-side surface 1002*a* or the back-side surface 1002*b* of the body 1002 with an plating process.

Inner interconnection patterns 1003*a* and via electrodes 1003*b* may be disposed in the body 1002. The via electrodes 1003*b* may electrically connect the inner interconnection patterns 1003*a* to the first outer interconnection patterns 1004 and the second interconnection patterns 1005. In various embodiments, the inner interconnection patterns 1003*a* may be formed to have a multi-layered structure.

The outer insulation layers 1006 and 1008 may be formed to cover the first outer interconnection patterns 1004 and the second interconnection patterns 1005. The outer insulation layers 1006 and 1008 may include a first outer insulation layer 1006 covering the first outer interconnection patterns 1004 and a second outer insulation layer 1008 covering the second outer interconnection patterns 1005. That is, the first outer insulation layer 1006 may be formed on the front-side surface 1002*a* of the body 1002 to cover the first outer interconnection patterns 1004. The second outer insulation layer 1008 may be formed on the back-side surface 1002*b* of the body 1002 to cover the second outer interconnection patterns 1005. The first and second outer insulation layers 1006 and 1008 may be formed of or include a solder resist material.

The first outer insulation layer 1006 may be formed to have first openings 1010*a* that expose portions of the first outer interconnection patterns 1004. The portions of the first outer interconnection patterns 1004 exposed by the first openings 1010*a* may act as substrate pads 1010. The second outer insulation layer 1008 may be formed to have second openings 1043 that expose portions of the second outer interconnection patterns 1005. The portions of the second outer interconnection patterns 1005 exposed by the second openings 1043 may serve as ball land pads 1044.

Figure 11:
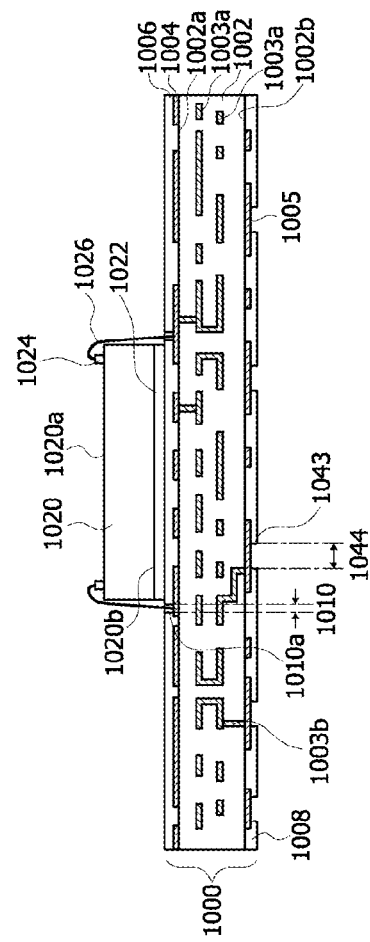

Referring to FIG. 11, a semiconductor chip 1020 may be mounted on the substrate 1000. The semiconductor chip 1020 may be fixed to the first outer insulation layer 1006 by, for example, an adhesive member 122 provided between the semiconductor chip 1020 and the first outer insulation layer 1006. The adhesive member 1022 may be, for example, an adhesive agent or an adhesive tape. In various embodiments, the adhesive member 1022 may be a die attach film (DAF).

A plurality of active devices, such as transistors, may be formed in the semiconductor chip 1020. In some cases, passive devices, such as capacitors and/or resistors, may also be formed in the semiconductor chip 1020. In various embodiments, the active devices may be formed in active layers adjacent to the front-side surface 1020*a* which is opposite a back-side surface 1020*b*.

A plurality of chip pads 1024 may be formed on the front-side surface 1020*a* of the semiconductor chip 1020. In an embodiment, the plurality of chip pads 1024 may be formed of or include an aluminum material or a copper material. The chip pads 1024 may be electrically connected to the substrate 1000.

The semiconductor chip 1020 may be electrically connected to the substrate 1000 through interconnection members 1026. In FIG. 11, an example in which the interconnection members 1026 are formed of metal wires is shown. As another example, semiconductor chip 1020 may be mounted on the substrate 1000 in a flip chip form. In such a case, the semiconductor chip 1020 may be electrically connected to the substrate 1000 through metal bumps without using metal wires. If the interconnection members 1026 are formed of metal wires, first ends of the metal wires may be bonded to the chip pads 1024 of the semiconductor chip 1020, and second ends of the metal wires may be bonded to the substrate pads 1010 of the substrate 1000.

Figure 12:
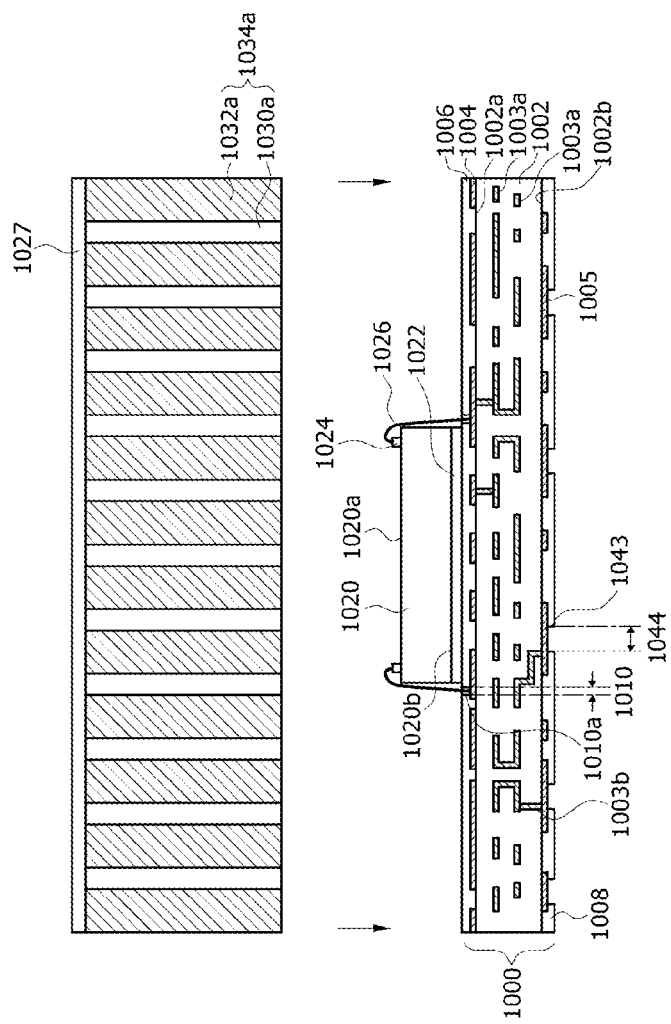
Figure 13:
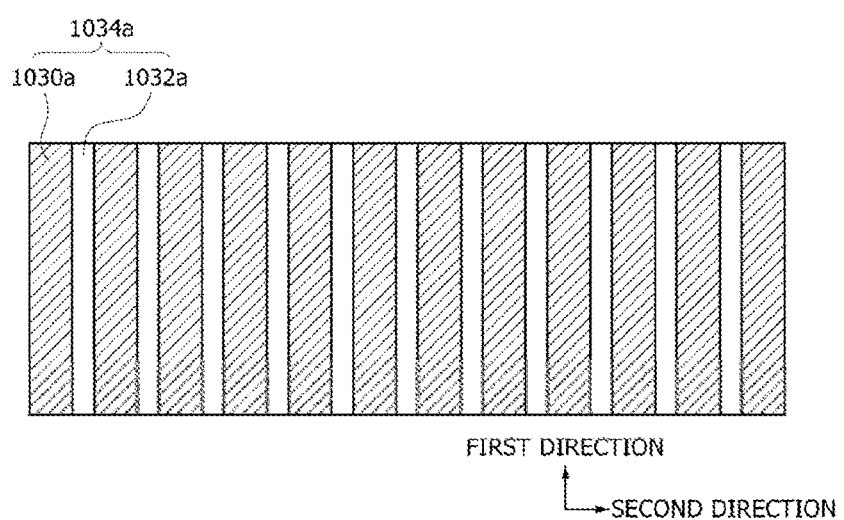

Referring to FIGS. 12 and 13, a pre-molding member 1034*a* may be disposed on the substrate 1000 on which the semiconductor chip 1020 is mounted. The pre-molding member 1034*a* may include first pre-molding members 1030*a* and second pre-molding members 1032*a*. In various embodiments, the pre-molding member 1034*a* may be attached to a surface of a carrier 1027, and the pre-molding member 1034*a* may be transferred with the carrier 1027.

Referring to FIG. 13 corresponding to a top plan view of the pre-molding member 1034*a* shown in FIG. 12, pre-molding member 1034*a* is shown to include the first pre-molding members 1030*a* and the second pre-molding members 1032*a*. Each one of the first pre-molding members 1030*a* and the second pre-molding members 1032*a* may be formed as rectangular or planar strips. The first pre-molding members 1030*a* and the second molding members 1032*a* may be alternately arranged or arrayed in a lateral direction. Put another way, the first pre-molding members 1030*a* and the second pre-molding members 1032a may be arranged in an alternating pattern. Alternatively, it may be said that the first pre-molding members 1030a and the second pre-molding members 1032a extend in a first direction to form planar or stripe shapes. In addition, the first pre-molding members 1030a and the second pre-molding members 1032a may be alternately arranged or arrayed in a second direction perpendicular to the first direction.

The first pre-molding members 1030a and the second pre-molding members 1032a may be laminated in a sheet type and may be attached to the carrier 1027. The first pre-molding members 1030a and the second pre-molding members 1032a may be fixed to the carrier 1027. The carrier 1027 may be detached from the first pre-molding members 1030a and the second pre-molding members 1032a in a subsequent process.

In various embodiments, the carrier 1027 may be formed of or include an adhesive film. The adhesive film may be detachable from the first pre-molding members 1030a and the second pre-molding members 1032a in a subsequent process. At this stage, pre-molding member 1034a including the first and second pre-molding members 1030a and 1032a is not yet cured.

Figure 14:
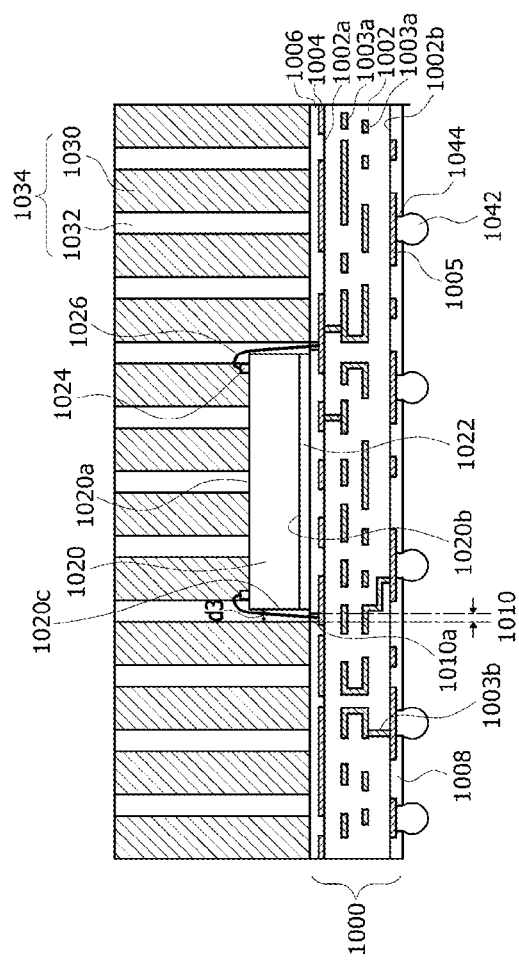
Figure 15:
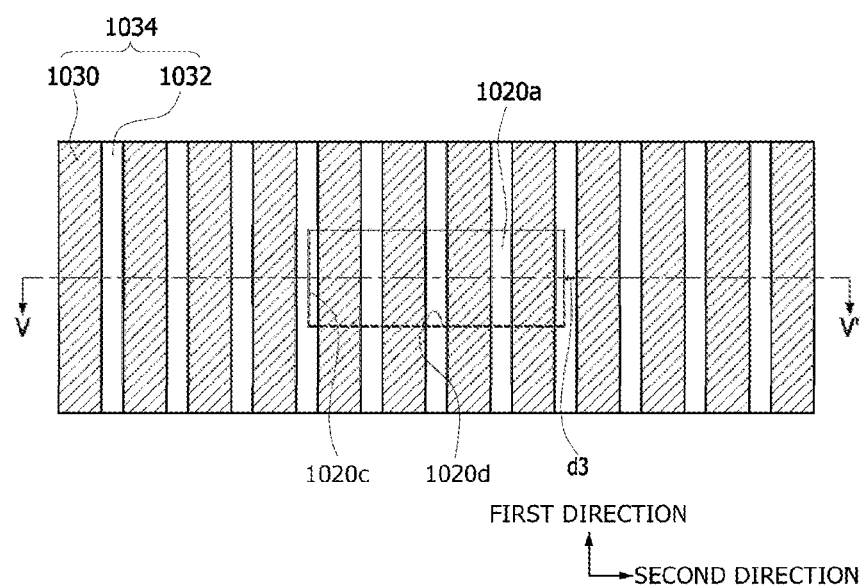

As illustrated in FIGS. 14 and 15, a molding part 1034 covering the semiconductor chip 1020 and the substrate 1000 may be formed. A cross-sectional view of FIG. 14 is taken along a line V-V' of FIG. 15. In order to form the molding part 1034, the carrier 1027 to which the pre-molding member 1034a is attached may be transferred onto the semiconductor chip 1020. The carrier 1027 may be pressed down toward the substrate 1000, as indicated by arrows in FIG. 12.

Next, the carrier 1027 may be removed from the pre-molding member 1034a. The pre-molding member 1034a may be cured to form the molding part 1034 which includes the first molding members 1030 and the second molding members 1032. The first molding members 1030 may extend in the first direction to form stripe shapes, and may be alternately arranged or arrayed in the second direction to be spaced apart from each other. The second molding members 1032 may be formed to fill gaps between the first molding members 1030. Accordingly, the second molding members 1032 may also extend in the first direction to form stripe shapes. As a result, the first molding members 1030 and the second molding members 1032 may be alternately arranged or arrayed in the second direction, and may extend in the first direction to form stripe shapes.

The first molding members 1030 may have a first Young's modulus and the second molding members 1032 may have a second Young's modulus, where the first Young's modulus is different from (e.g. greater than) the second Young's modulus.

The first Young's modulus may be greater than the second Young's modulus by a predetermined percentage, or by a predetermined percentage within a range of predetermined percentages. For example, the first Young's modulus may be greater than the second Young's modulus by 100% or greater. As another example, the first Young's modulus may be greater than the second Young's modulus by a percentage within a range of 100-4000%. However, any suitable percentage selected to achieve the desired purposes may be utilized. The first molding members 1030 may be formed of or include an insulation material having a first Young's modulus within a range of about 20 GPa to about 30 GPa. In various embodiments, the insulation material having the first Young's modulus may include an epoxy molding compound (EMC) material.

Further, the second molding members 1032 may be formed to include an insulation material having the second Young's modulus within a range of about 0.01 GPa to about 0.1 GPa. In various embodiments, the insulation material having the second Young's modulus may be formed of or include, for example, a silicone resin material or a silicone rubber material.

Because the first molding members 1030 are formed of a material having the first Young's modulus that is greater than the second Young's modulus of the second molding members 1032, the second physical flexibility of the second molding members 1032 may be greater than the first physical flexibility of the first molding members 1030. Accordingly, the second molding members 1032 may be more readily flexed, twisted, or warped as compared with the first molding members 1030 when an external force is applied to the molding part 1034.

The first molding members 1030 may be more rigid than the second molding members 1032. Thus, two of the first molding members 1030 may be disposed on both outermost edges of the substrate 1000 to serve as supporters to maintain an outline of the molding part 1034. In addition, the first molding members 1030 closest to the semiconductor chip 1020 may be spaced apart from the first sidewalls 1020c by a distance "d3". Gaps between the first molding members 1030 and the semiconductor chip 1020 may have the second molding members 1032.

Some of the first and second molding members 1030 and 1032 may extend in the first direction to overlap with two opposite second sidewalls 1020d, respectively, of the semiconductor chip 120. In addition, first and second molding members 1030 and 1032 may overlap with the front-side surface 1020a which corresponds to a top surface of the semiconductor chip 1020. External connection terminals 1042 may be formed on the ball land pads 1044 which are exposed by the second openings 1043 of the second outer insulation layer 1008. The external connection terminals 1042 may be formed of or include solder balls.

Although the above embodiment is described in conjunction with an example in which the molding part 1034 is formed using the sheet type pre-molding member 1034a, the present disclosure is not limited thereto. For example, in various embodiments, the molding part 1034 may be formed using a transfer molding method or a pin gate molding method.

FIGS. 16 to 20 are cross-sectional views and a plan view illustrating a method of fabricating a semiconductor package according to an embodiment.

Figure 16:
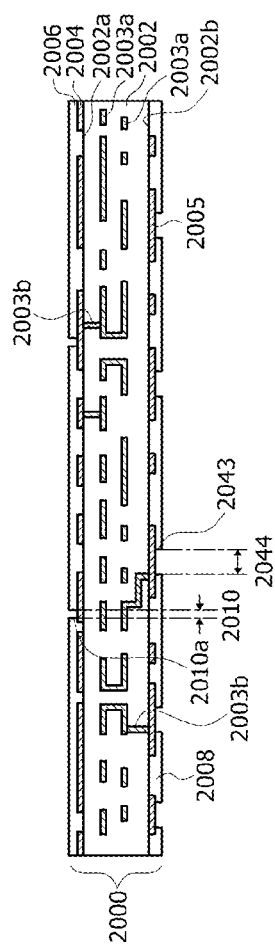
FIGS. 16 to 20 are cross-sectional views and a plan view illustrating a method of fabricating a semiconductor package according to an embodiment.

Referring to FIG. 16, a substrate 2000 may be provided. The substrate 2000 may include a body 2002, outer interconnection patterns 2004 and 2005 formed on two opposite surfaces of the body 1002, and outer insulation layers 2006 and 2008 covering the outer interconnection patterns 2004 and 2005. The substrate 2000 may be formed of or include a flexible material. In various embodiments, the substrate 2000 may be a flexible PCB, a flexible insulation substrate, or a flexible organic substrate. The body 2002 may include a front-side surface 2002a and a back-side surface 2002b that are opposite to each other.

The outer interconnection patterns 2004 and 2005 may include first outer interconnection patterns 2004 formed on the front-side surface 2002a of the body 2002 and second interconnection patterns 2005 formed on the back-side surface 2002b of the body 2002. The first outer interconnection patterns 2004 or the second interconnection patterns 2005 may be formed by a subtractive method or by an additive method. Inner interconnection patterns 2003a and via electrodes 2003b may be disposed in the body 2002. The via electrodes 2003b may electrically connect the inner interconnection patterns 2003a to the first outer interconnection patterns 2004 and the second interconnection patterns 2005.

The outer insulation layers 2006 and 2008 may include a first outer insulation layer 2006 covering the first outer interconnection patterns 2004 and a second outer insulation layer 2008 covering the second outer interconnection patterns 2005. That is, the first outer insulation layer 2006 may be formed on the front-side surface 2002a of the body 2002 to cover the first outer interconnection patterns 2004. Further, the second outer insulation layer 2008 may be formed on the back-side surface 2002b of the body 2002 to cover the second outer interconnection patterns 2005. In an embodiment, the first and second outer insulation layers 2006 and 2008 may be formed of or include a solder resist material.

The first outer insulation layer 2006 may be formed to have first openings 2010a that expose portions of the first outer interconnection patterns 2004. The portions of the first outer interconnection patterns 2004 exposed by the first openings 2010a may act as substrate pads 2010. The second outer insulation layer 2008 may be formed to have second openings 2043 that expose portions of the second outer interconnection patterns 2005. The portions of the second outer interconnection patterns 2005 exposed by the second openings 2043 may act as ball land pads 2044.

Figure 17:
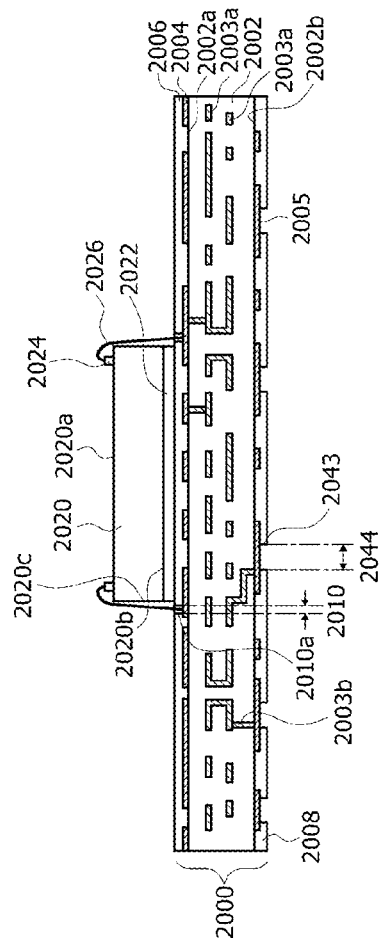

Referring to FIG. 17, a semiconductor chip 2020 may be mounted on the substrate 2000. The semiconductor chip 2020 may be fixed to the first outer insulation layer 2006 by, for example, an adhesive member 122 provided between the semiconductor chip 2020 and the first outer insulation layer 2006. The adhesive member 2022 may be, for example, an adhesive agent or an adhesive tape. In various embodiments, the adhesive member 2022 may be a die attach film (DAF).

In various embodiments, active layers may be formed adjacent to a front-side surface 2020a which is opposite a back-side surface 2020b. A plurality of chip pads 2024 may be disposed on the front-side surface 2020a of the semiconductor chip 2020. The plurality of chip pads 2024 may be formed of or include an aluminum material or a copper material. The chip pads 2024 may be electrically connected to the substrate 2000.

The semiconductor chip 2020 may be electrically connected to the substrate 2000 through interconnection members 2026. The interconnection members 2026 may be metal wires. In various embodiments, the semiconductor chip 2020 may be a flip chip. In such a case, the semiconductor chip 2020 may be electrically connected to the substrate 2000 through metal bumps without using metal wires. If the interconnection members 2026 are formed of metal wires, first ends of the metal wires may be bonded to the chip pads 2024 of the semiconductor chip 2020 and second ends of the metal wires may be bonded to the substrate pads 2010 of the substrate 2000.

Figure 18:
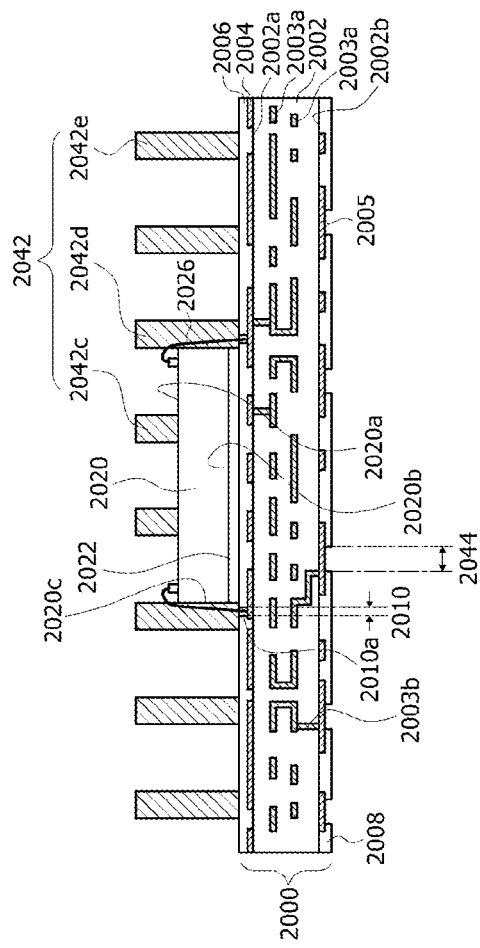

Referring to FIG. 18, first molding members 2042 may be formed on the substrate 200 and the semiconductor chip 2020. The first molding members 2042 may be formed using a compression molding technique or a pin point gate molding technique with a grid-shaped mold.

The first molding members 2042 may be formed or include an insulation material having a first Young's modulus. In an embodiment, the first molding members 2042 may be formed to include an insulation material having the first Young's modulus of about 20 GPa to about 30 GPa. In various embodiments, the insulation material having the first Young's modulus may be formed of or include an epoxy molding compound (EMC) material. The first molding members 2042 may be formed so that top surfaces of the first molding members 2042 are located at a level higher than the front-side surface 2020a of the semiconductor chip 2020.

Figure 19:
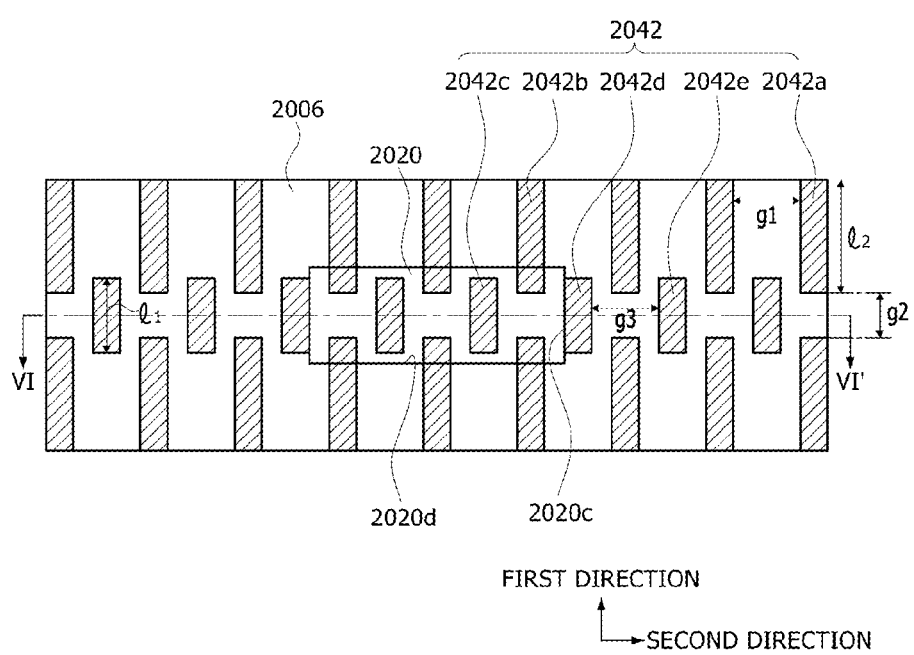

Referring to FIG. 19 corresponding to a top plan view of FIG. 18, the first molding members 2042 may include first patterns 2042a and 2042b and second patterns 2042c, 2042d and 2042e. The first patterns 2042a and 2042b may be formed to have a first length L1 which is greater than a second length L2 of the second patterns 2042c, 2042d and 2042e, but the present disclosure is not limited thereto. For example, in various embodiments, the first patterns 2042a and 2042b may be formed to have the same length as the second patterns 2042c, 2042d and 2042e.

The semiconductor chip 2020 may include a pair of second sidewalls 2020c which are opposite to each other and parallel with a first direction. In addition, a pair of first sidewalls 2020d which are opposite to each other and parallel with a second direction perpendicular to the first direction.

In an embodiment, the first patterns 2042a and 2042b of the first molding members 2042 may be arranged or arrayed in a matrix form along the first and second directions. The first patterns 2042a and 2042b may include a first group of the first patterns 2042a arranged on adjacent sides of the second sidewalls 2020c of the semiconductor chip 2020 to extend in the first direction. A second group of the first patterns 2042b may be arranged on adjacent sides of the first sidewalls 2020d of the semiconductor chip 2020 to extend in the first direction. The second group of the first patterns 2042b may extend in the first direction to overlap with portions of the front-side surface 2020a of the semiconductor chip 2020. The first patterns 2042a and 2042b may be spaced apart from each other in the second direction by a first distance "g1" and may be spaced apart from each other in the first direction by a second distance "g2".

The second patterns 2042c, 2042d and 2042e may include a first group of the second patterns 2042c, a second group of the second patterns 2042d, and a third group of the second patterns 2042e. The first ground of the second patterns 2042c may be disposed on the front-side surface 2020a of the semiconductor chip 2020. The second group of the second patterns 2042d may be disposed to contact the second sidewalls 2020c of the semiconductor chip 2020. The third group of the second patterns 2042e may be disposed between the first group of the first patterns 2042a. The second patterns 2042c, 2042d and 2042e may be disposed to be spaced apart from each other in the second direction by a third distance "g3". Accordingly, the first patterns 2042a and 2042b and the second patterns 2042c, 2042d and 2042e may be arranged or arrayed in a grid form.

Figure 20:
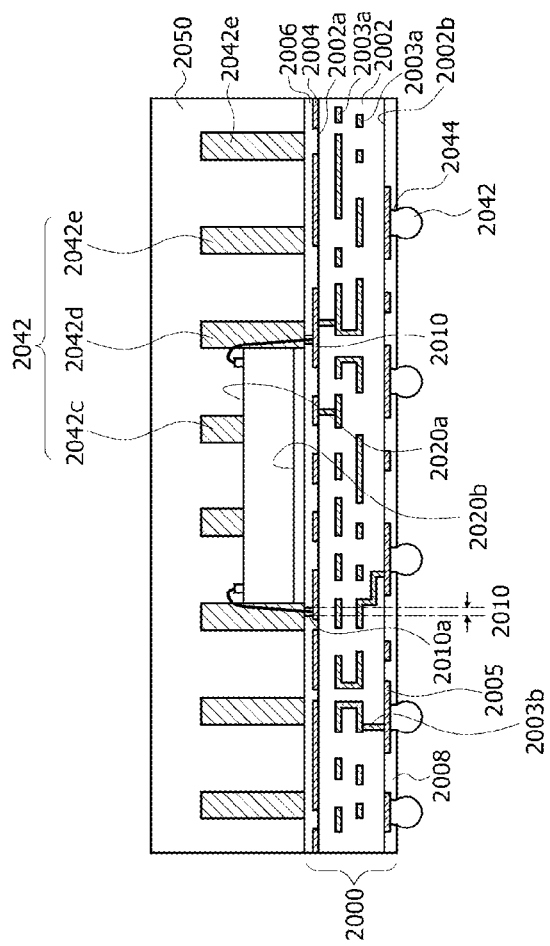

Referring to FIG. 20, a second molding member 2050 may be formed on the substrate 200 having the first molding members 2042 disposed thereon. In order to form the second molding member 2050, a pre-molding material having a liquid state or a semi-cured state may be supplied or laminated onto the substrate 2000 having the first molding members 2042 arranged in a grid form. As a result, spaces between the first molding members 2042 may be filled with the pre-molding material having a liquid state or a semi-cured state. The pre-molding material may be supplied until the top surfaces of the first molding members 2042 are covered with the pre-molding material.

Subsequently, the pre-molding material may be cured to form the second molding member 2050. If the pre-molding material is cured, a property of the pre-molding material may be changed so that the cured pre-molding material has a stable state. As a result, the second molding member 2050 may absorb external shock or external impact to protect the semiconductor chip 2020. If the pre-molding material is not cured, the pre-molding material having a liquid state or a semi-cured state may be detached from the substrate 2000 and the first molding members 2042.

The second molding members 2050 may have a second Young's modulus and the first molding members 2042 may have a first Young's modulus, where the first Young's modulus is different from (e.g. greater than) the second Young's modulus.

The first Young's modulus may be greater than the second Young's modulus by a predetermined percentage, or by a predetermined percentage within a range of predetermined percentages. For example, the first Young's modulus may be greater than the second Young's modulus by 100% or greater. As another example, the first Young's modulus may be greater than the second Young's modulus by a percentage within a range of 100-4000%. However, any suitable percentage selected to achieve the desired purposes may be utilized.

As an example, if an EMC material having the first Young's modulus of about 20 GPa to about 30 GPa is employed as a material of the first molding members 2042, the second molding member 2050 may be formed of or include a material having the second Young's modulus of about 0.01 GPa to about 0.1 GPa. That is, the second molding member 2050 may be formed to have a first physical flexibility greater than a second physical flexibility of the first molding members 2042.

Accordingly, the second molding members 2050 may be more readily flexed, twisted, or warped as compared with the first molding members 2042 when an external force is applied to the first and second molding members 2042 and 2050. External connection terminals 2042 may then be formed on the ball land pads 2044. The external connection terminals 2042 may be formed of solder balls.

The semiconductor packages described above may be applied to various electronic systems.

Figure 21:
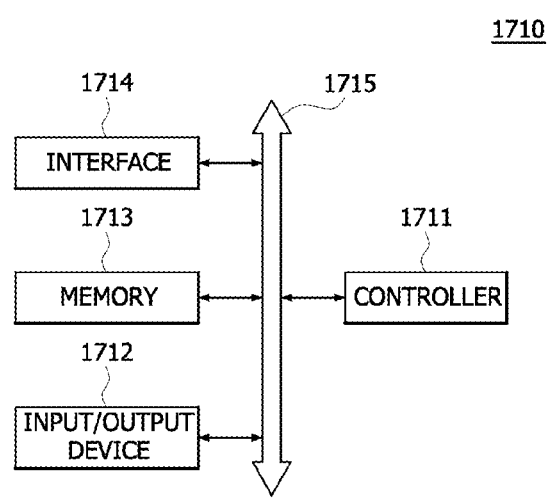
FIG. 21 is a block diagram illustrating an electronic system including at least one semiconductor package in accordance with various embodiments.

Referring to FIG. 21, the semiconductor package in accordance with an embodiment may be applied to an electronic system 1710. The electronic system 1710 may include a controller 1711, an input/output unit 1712, and a memory 1713. The controller 1711, the input/output unit 1712 and the memory 1713 may be coupled with one another through a bus 1715 providing a path through which data are transmitted.

The controller 1711 may include at least any one of at least one microprocessor, at least one digital signal processor, at least one microcontroller, and other (e.g. logic) devices configured to perform the same or similar functions as these components. At least one of the controller 1711 and the memory 1713 may include at least any one of the semiconductor packages according to the embodiments of the present disclosure. The input/output unit 1712 may include at least one selected among a keypad, a keyboard, a display device, a touch screen and so forth. The memory 1713 is a device for storing data. The memory 1713 may store data and/or commands to be executed by the controller 1711, and the likes.

The memory 1713 may include a volatile memory device such as a DRAM and/or a nonvolatile memory device such as a flash memory. For example, a flash memory may be mounted to an information processing system such as a mobile terminal or a desk top computer. The flash memory may constitute a solid state disk (SSD). In this example, the electronic system 1710 may stably store a large amount of data in a flash memory system.

The electronic system 1710 may further include an interface 1714 configured to transmit and receive data to and from a communication network. The interface 1714 may be a wired or wireless type. For example, the interface 1714 may include an antenna or a wired or wireless transceiver.

The electronic system 1710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

In an embodiment wherein the electronic system 1710 is an equipment capable of performing wireless communication, the electronic system 1710 may be used in a communication system such as, for example but not limited to, CDMA (code division multiple access), GSM (global system for mobile communications), NADC (north American digital cellular), E-TDMA (enhanced-time division multiple access), WCDMA (wideband code division multiple access), CDMA2000, LTE (long term evolution) and Wibro (wireless broadband Internet).

Figure 22:
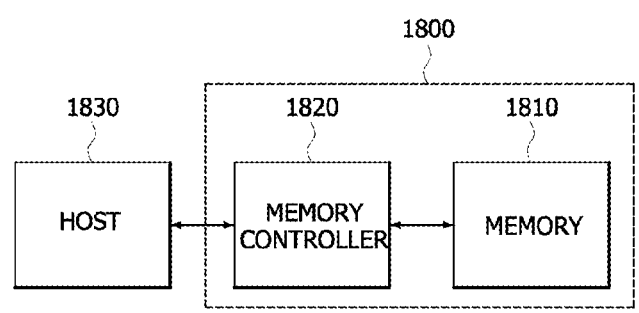
FIG. 22 is a block diagram illustrating an electronic system including a memory card having at least one semiconductor package in accordance with various embodiments.

Referring to FIG. 22, the semiconductor packages in accordance with the embodiments may be provided in the form of a memory card 1800. For example, the memory card 1800 may include a memory 1810 such as a nonvolatile memory device and a memory controller 1820. The memory 1810 and the memory controller 1820 may store data or read stored data.

The memory 1810 may include at least any one among nonvolatile memory devices to which the packaging technology of the embodiments of the present disclosure is applied. The memory controller 1820 may control the memory 1810 such that stored data is read out or data is stored in response to a read/write request from a host 1830.

Various embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims. For example, the first and/or the second molding members may be formed into shapes other than planar or rectangular shapes, such as cylindrical shapes or squared cylindrical shapes, etc.

The invention claimed is:

1. A semiconductor package comprising:
    a semiconductor chip electrically connected to a substrate; and
    a molding part disposed on the substrate and the semiconductor chip, and including first molding members and second molding members arranged in an alternating pattern,
    wherein the first molding members have a first physical flexibility and the second molding members have a second physical flexibility, the first physical flexibility being different from the second physical flexibility.

2. The semiconductor package of claim 1, further comprising:
    interconnection members electrically connecting the semiconductor chip to the substrate.

3. The semiconductor package of claim 1, wherein the first physical flexibility is less than the second physical flexibility.

4. The semiconductor package of claim 1, the substrate includes:

a body having a front-side surface and a back-side surface that are opposite to each other;

first outer interconnection patterns disposed on the front-side surface of the body;

second outer interconnection patterns disposed on the back-side surface of the body;

a first outer insulation layer covering the first outer interconnection patterns;

a second outer insulation layer covering the second outer interconnection patterns;

inner interconnection patterns disposed in the body to have a multi-layered structure; and via electrodes disposed in the body to connect the first and second outer interconnection patterns to the inner interconnection patterns.

5. The semiconductor package of claim 4, wherein the body includes a flexible insulation material or a flexible organic material.

6. The semiconductor package of claim 4, wherein the first outer interconnection patterns include substrate pads connected to the interconnection members.

7. The semiconductor package of claim 2, wherein the interconnection members include metal wires or metal bumps.

8. The semiconductor package of claim 1, wherein the first molding members extend in a first direction along a surface of the substrate to have a stripe shape, and arranged along the surface of the body in a second direction perpendicular to the first direction to be spaced apart from each other by a predetermined distance; and wherein the second molding members are disposed between the first molding members in a stripe shape to provide the arrangement in the alternating pattern.

9. The semiconductor package of claim 1, wherein the first molding members and the second molding members are arranged in an alternating pattern.

10. The semiconductor package of claim 1, wherein each of the first molding members includes a first material having a first Young's modulus; and wherein each of the second molding members includes a second material having a second Young's modulus which is less than the first Young's modulus.

11. The semiconductor package of claim 10, wherein the first Young's modulus is greater than the second Young's modulus by 100% or greater.

12. The semiconductor package of claim 10, wherein the first Young's modulus is greater than the second Young's modulus by a percentage within a range of 100-4000%, the first Young's modulus is within a range of about 20 gigapascals (GPa) to about 30 GPa.

13. The semiconductor package of claim 10, wherein each of the first molding members is formed of or includes an epoxy molding compound (EMC) material.

14. The semiconductor package of claim 10, wherein each of the second molding members is formed of or includes an insulation material having a second Young's modulus within a range of about 0.01 GPa to about 0.1 GPa.

15. The semiconductor package of claim 14, wherein each of the second molding members includes a silicone resin material or a silicone rubber material.

16. The semiconductor package of claim 1, wherein at least two of the first molding members are disposed on both outermost edges of the substrate to serve as supporters to maintain an outline of the molding part.

17. The semiconductor package of claim 1, wherein at least one of the first molding members and at least one of the second molding members are disposed to cross the semiconductor chip and to overlap with two opposite sidewalls and a top surface of the semiconductor chip.

18. The semiconductor package of claim 1, wherein the first molding members includes:

first patterns extending in a first direction along a surface of the substrate to have a stripe shape, and arranged in a second direction perpendicular to the first direction along the surface of the substrate to be spaced apart from each other; and second patterns which are spaced apart from two opposite sidewalls of the semiconductor chip in the second direction, wherein the second molding members are disposed between the first molding members.

19. The semiconductor package of claim 18, wherein the first patterns closest to the semiconductor chip are spaced apart from two opposite sidewalls of the semiconductor chip in the first direction.

20. The semiconductor package of claim 1, wherein the second molding members are disposed on adjacent sides of sidewalls of the semiconductor chip.

21. The semiconductor package of claim 1, wherein the first molding members includes:

first patterns extending in a first direction along a surface of the substrate to have a stripe shape, and arranged in a second direction perpendicular to the first direction along the surface of the substrate to be spaced apart from each other; and second patterns disposed to contact two opposite sidewalls of the semiconductor chip in the second direction, wherein the second molding members are disposed between the first molding members.

22. The semiconductor package of claim 21, wherein top surfaces of the first and second patterns are located at a level higher than a top surface of the semiconductor chip; and wherein the second molding members are disposed over the top surfaces of the first and second patterns to form a single second molding member covering the top surfaces of the first and second patterns.

23. The semiconductor package of claim 22, wherein the single second molding member includes a silicone resin material or a silicone rubber material.

* * * * *